United States Patent
Song et al.

(10) Patent No.: US 12,086,060 B2
(45) Date of Patent: Sep. 10, 2024

(54) INTERCONNECT BASED ADDRESS MAPPING FOR IMPROVED RELIABILITY

(71) Applicant: Rambus Inc., San Jose, CA (US)

(72) Inventors: Taeksang Song, San Jose, CA (US); Steven C. Woo, Saratoga, CA (US); Torsten Partsch, San Jose, CA (US)

(73) Assignee: Rambus Inc., San Jose, CA (US)

( * ) Notice: Subject to any disclaimer, the term of this patent is extended or adjusted under 35 U.S.C. 154(b) by 101 days.

(21) Appl. No.: 17/893,790

(22) Filed: Aug. 23, 2022

(65) Prior Publication Data

US 2023/0081231 A1    Mar. 16, 2023

Related U.S. Application Data

(60) Provisional application No. 63/329,707, filed on Apr. 11, 2022, provisional application No. 63/241,304, filed on Sep. 7, 2021.

(51) Int. Cl.
*G06F 12/06* (2006.01)
*G11C 11/408* (2006.01)

(52) U.S. Cl.
CPC .......... *G06F 12/06* (2013.01); *G11C 11/4087* (2013.01); *G06F 2212/1032* (2013.01)

(58) Field of Classification Search
None
See application file for complete search history.

(56) References Cited

U.S. PATENT DOCUMENTS

| | | | |
|---|---|---|---|
| 6,446,184 B2 | 9/2002 | Dell et al. | |
| 8,595,428 B2 | 11/2013 | Bains et al. | |
| 2014/0281207 A1* | 9/2014 | Mandava | G11C 7/02 |
| | | | 711/106 |
| 2015/0089183 A1* | 3/2015 | Bains | G06F 12/0292 |
| | | | 711/202 |
| 2019/0198090 A1* | 6/2019 | Lee | G11C 29/70 |
| 2022/0188243 A1* | 6/2022 | Hyun | G06F 12/10 |

(Continued)

OTHER PUBLICATIONS

Jian et al. "Parity Helix: Efficient Protection for Single-Dimensional Faults in Multi-dimensional Memory Systems." Mar. 2016. IEEE. HPCA 2016. pp. 555-567.*

(Continued)

*Primary Examiner* — Nathan Sadler
(74) *Attorney, Agent, or Firm* — The Neudeck Law Firm, LLC

(57) ABSTRACT

Row addresses received by a module are mapped before being received by the memory devices of the module such that row hammer affects different neighboring row addresses in each memory device. Thus, because the mapped respective, externally received, row addresses applied to each device ensure that each set of neighboring rows for a given row address received by the module is different for each memory device on the module, row hammering of a given externally addressed row spreads the row hammering errors across different externally addressed rows on each memory device. This has the effect of confining the row hammer errors for each row that is hammered to a single memory device per externally addressed neighboring row. By confining the row hammer errors to a single memory device, the row hammer errors are correctible using a SDDC scheme.

20 Claims, 9 Drawing Sheets

(56) References Cited

U.S. PATENT DOCUMENTS

2023/0072394 A1* 3/2023 Haywood ............ G11C 7/1006
2023/0238049 A1* 7/2023 Thirumala .......... G06F 11/1068
                  365/230.01

OTHER PUBLICATIONS

Kim et al. "An Effective DRAM Address Remapping for Mitigating Rowhammer Errors." Sep. 2019. IEEE. IEEE Transactions on Computers. vol. 68. pp. 1428-1441.*
Wang et al. "Reinforce Memory Error Protection by Breaking DRAM Disturbance Correlation Within ECC Words." Nov. 2019. IEEE. ICCD 2019. pp. 672-675.*
Kim et al. "How to Kill the Second Bird with One ECC: The Pursuit of Row Hammer Resilient DRAM." Nov. 2023. ACM. Micro '23.*
Frigo, Pietro et al., "TRRespass: Exploiting the Many Sides of Target Row Refresh", Security and Privacy Conference, May 2020, Downloaded at: https://download.vusec.net/papers/trespass_sp20.pdf. 16 pages.

* cited by examiner

```
┌─────────────────────────────────────────────────────────────┐
│ RECEIVE, VIA A COMMAND/ADDRESS INTERFACE, A FIRST ROW       │
│ ADDRESS COMPOSED OF A FIRST PLURALITY OF ADDRESS BITS       │
│                          302                                │
└─────────────────────────────────────────────────────────────┘
                              │
┌─────────────────────────────────────────────────────────────┐
│ RECEIVE, BY A FIRST DYNAMIC RANDOM ACCESS MEMORY (DRAM)     │
│ DEVICE ON THE MEMORY MODULE THAT INCLUDES A FIRST MEMORY    │
│ ARRAY, A SECOND ROW ADDRESS COMPOSED OF A FIRST             │
│ PERMUTATION OF THE FIRST PLURALITY OF ADDRESS BITS          │
│                          304                                │
└─────────────────────────────────────────────────────────────┘
                              │
┌─────────────────────────────────────────────────────────────┐
│ BASED ON THE SECOND ROW ADDRESS, ACCESSING A FIRST ROW IN   │
│ THE FIRST MEMORY ARRAY THAT HAS A FIRST INTERNAL ROW        │
│ ADDRESS, WHERE THE FIRST ROW IS PHYSICALLY NEXT TO A FIRST  │
│ NEIGHBORING ROW HAVING A FIRST INTERNAL NEIGHBORING ROW     │
│ ADDRESS                                                     │
│                          306                                │
└─────────────────────────────────────────────────────────────┘
                              │
┌─────────────────────────────────────────────────────────────┐
│ RECEIVE, BY A SECOND DRAM DEVICE ON THE MEMORY MODULE       │
│ THAT INCLUDES A SECOND MEMORY ARRAY, A THIRD ROW ADDRESS    │
│ COMPOSED OF A SECOND PERMUTATION OF THE FIRST PLURALITY     │
│ OF ADDRESS BITS                                             │
│                          308                                │
└─────────────────────────────────────────────────────────────┘
                              │
┌─────────────────────────────────────────────────────────────┐
│ BASED ON THE THIRD ROW ADDRESS, ACCESSING A SECOND ROW IN   │
│ THE SECOND MEMORY ARRAY THAT HAS A SECOND INTERNAL ROW      │
│ ADDRESS, WHERE THE SECOND ROW IS PHYSICALLY NEXT TO A       │
│ SECOND NEIGHBORING ROW HAVING A SECOND INTERNAL             │
│ NEIGHBORING ROW ADDRESS, WHEREIN A FIRST EXTERNAL ROW       │
│ ADDRESS RECEIVED VIA THE COMMAND/ADDRESS INTERFACE THAT     │
│ MAPS TO THE FIRST INTERNAL NEIGHBORING ROW ADDRESS AND A    │
│ SECOND EXTERNAL ROW ADDRESS RECEIVED VIA THE COMMAND/       │
│ ADDRESS INTERFACE THAT MAPS TO THE SECOND INTERNAL          │
│ NEIGHBORING ROW ADDRESS ARE NOT EQUAL.                      │
│                          310                                │
└─────────────────────────────────────────────────────────────┘
```

*FIG. 3*

```
┌─────────────────────────────────────────────┐
│ RECEIVE, BY A MEMORY MODULE THAT INCLUDES A FIRST │
│ MEMORY DEVICE AND A SECOND MEMORY DEVICE, A FIRST │
│     TRAINING SEQUENCE OF ADDRESS VALUES     │
│                     502                     │
└─────────────────────────────────────────────┘
                      │
┌─────────────────────────────────────────────┐
│ TRANSFORM, USING A FIRST PERMUTATION OF BITS IN THE ADDRESS │
│  VALUES AND BY THE MEMORY MODULE, THE FIRST TRAINING        │
│  SEQUENCE OF ADDRESS VALUES TO A FIRST TRANSFORMED          │
│              SEQUENCE OF ADDRESS VALUES                     │
│                        504                                  │
└─────────────────────────────────────────────┘
                      │
┌─────────────────────────────────────────────┐
│   RECEIVE, BY THE FIRST MEMORY DEVICE, THE FIRST   │
│     TRANSFORMED SEQUENCE OF ADDRESS VALUES         │
│                     506                            │
└─────────────────────────────────────────────┘
                      │
┌─────────────────────────────────────────────┐
│ TRANSFORM, USING A SECOND PERMUTATION OF BITS IN THE │
│ ADDRESS VALUES AND BY THE MEMORY MODULE, THE FIRST   │
│ TRAINING SEQUENCE OF ADDRESS VALUES TO A SECOND      │
│      TRANSFORMED SEQUENCE OF ADDRESS VALUES          │
│                      508                             │
└─────────────────────────────────────────────┘
                      │
┌─────────────────────────────────────────────┐
│ RECEIVE, BY THE SECOND MEMORY DEVICE, THE SECOND │
│   TRANSFORMED SEQUENCE OF ADDRESS VALUES         │
│                    510                           │
└─────────────────────────────────────────────┘
                      │
┌─────────────────────────────────────────────┐
│   BASED ON THE FIRST TRANSFORMED SEQUENCE OF        │
│ ADDRESS VALUES, DETERMINE THAT THE FIRST MEMORY     │
│  DEVICE IS RECEIVING ADDRESSES THAT HAVE BEEN       │
│ TRANSFORMED BY AT LEAST THE FIRST PERMUTATION       │
│                     512                             │
└─────────────────────────────────────────────┘
                      │
┌─────────────────────────────────────────────┐
│  BASED ON THE SECOND TRANSFORMED SEQUENCE OF         │
│ ADDRESS VALUES, DETERMINE THAT THE SECOND MEMORY     │
│  DEVICE IS RECEIVING ADDRESSES THAT HAVE BEEN        │
│ TRANSFORMED BY AT LEAST THE SECOND PERMUTATION       │
│                     514                              │
└─────────────────────────────────────────────┘
```

*FIG. 5*

RECEIVE A FIRST INDICATOR THAT A FIRST MEMORY DEVICE ON A MEMORY MODULE IS RECEIVING ADDRESSES THAT HAVE BEEN TRANSFORMED BY AT LEAST A FIRST PERMUTATION
602

RECEIVE A SECOND INDICATOR THAT A SECOND MEMORY DEVICE ON THE MEMORY MODULE IS RECEIVING ADDRESSES THAT HAVE BEEN TRANSFORMED BY AT LEAST A SECOND PERMUTATION
604

CONFIGURE THE FIRST MEMORY DEVICE TO REVERSE THE FIRST PERMUTATION ON RECEIVED ADDRESSES
606

CONFIGURE THE SECOND MEMORY DEVICE TO REVERSE THE SECOND PERMUTATION ON RECEIVED ADDRESSES
608

TRANSMIT A FIRST ADDRESS TO THE MEMORY MODULE
610

USE, BY THE FIRST MEMORY DEVICE, AN UNPERMUTED VERSION OF THE FIRST ADDRESS
612

USE, BY THE SECOND MEMORY DEVICE, AN UNPERMUTED VERSION OF THE FIRST ADDRESS
614

*FIG. 6*

RECEIVE A FIRST INDICATOR THAT A FIRST MEMORY DEVICE ON A MEMORY MODULE IS RECEIVING ADDRESSES THAT HAVE BEEN TRANSFORMED, BY THE MEMORY MODULE AND BY A FIRST TRANSFORMATION THAT INCLUDES A FIRST PERMUTATION
702

RECEIVE A SECOND INDICATOR THAT A SECOND MEMORY DEVICE ON THE MEMORY MODULE IS RECEIVING ADDRESSES THAT HAVE BEEN TRANSFORMED, BY THE MEMORY MODULE AND BY A SECOND TRANSFORMATION THAT INCLUDES A SECOND PERMUTATION THAT IS NOT EQUIVALENT TO THE FIRST PERMUTATION
704

APPLY, TO A FIRST ADDRESS VALUE, A FIRST REVERSE TRANSFORMATION OF THE FIRST TRANSFORMATION TO GENERATE A SECOND ADDRESS VALUE
706

TRANSMIT, TO THE MEMORY MODULE, THE SECOND ADDRESS VALUE
708

RECEIVE, BY THE FIRST MEMORY DEVICE, THE FIRST ADDRESS VALUE
710

APPLY, TO A FIRST ADDRESS VALUE, A SECOND REVERSE TRANSFORMATION OF THE SECOND TRANSFORMATION TO GENERATE A THIRD ADDRESS VALUE
712

TRANSMIT, TO THE MEMORY MODULE, THE THIRD ADDRESS VALUE
714

RECEIVE, BY THE SECOND MEMORY DEVICE, THE FIRST ADDRESS VALUE
716

*FIG. 7*

INTERCONNECT BASED ADDRESS MAPPING FOR IMPROVED RELIABILITY

BRIEF DESCRIPTION OF THE DRAWINGS

FIG. 3 is a flowchart illustrating a method of operating a memory module.

FIG. 5 is a flowchart illustrating a method of determining address transformations.

FIG. 6 is a flowchart illustrating a method of reversing address transformations.

FIG. 7 is a flowchart illustrating a method of transmitting addresses.

DETAILED DESCRIPTION OF THE EMBODIMENTS

Figure 1A:
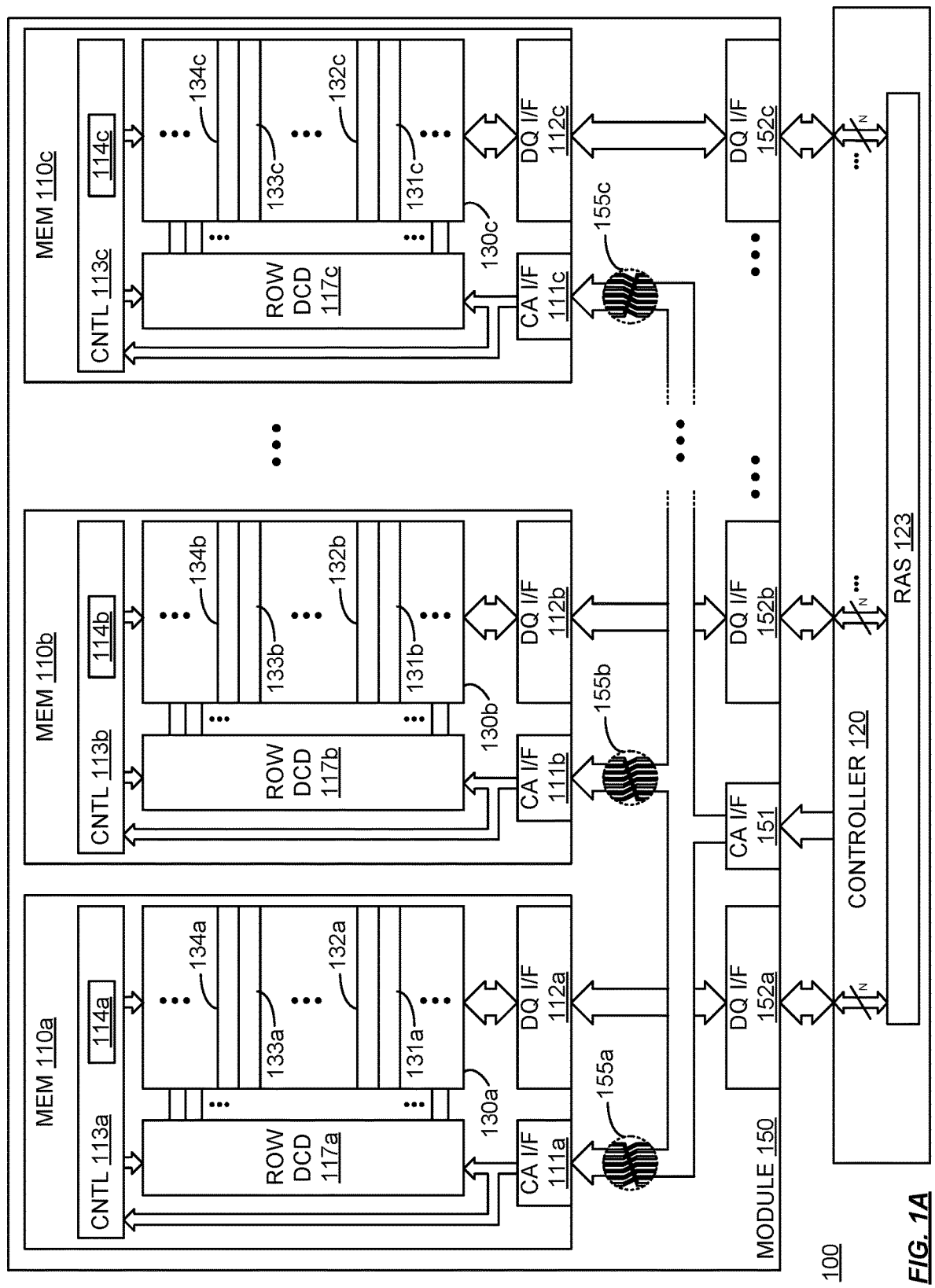
FIGS. 1A-1B are a block diagrams illustrating an example memory system.

Repeated row activations of the same row in a memory device (e.g., dynamic random access memory—DRAM), whether malicious or accidental, may cause cells in the neighborhood of the repeatedly activated row to lose a stored value. This effect on storage reliability has been termed "row hammer." Row hammer, when applied to the multiple, parallel, memory device accesses that occur with memory modules, can cause multiple errors across multiple devices on the module. When many errors occur across multiple memory devices, error detection and correction schemes such as Chipkill (a.k.a., "single device data correct"—SDDC) and SSDC/DSDD (i.e., "single symbol data correct"—SSDC with "double symbol data detect"—DSDD) may be overwhelmed by the number and distribution of errors and thereby unable to correct these row hammer caused errors (or in some cases, detect the errors).

In an embodiment, row addressing received by a module is mapped before being received by the memory devices of the module such that row hammer affects different neighboring row addresses in each memory device. Thus, because the mapped respective, externally received, row addresses applied to each device (i.e., the addresses received via the command/address interface of a given device) to respective internal row addresses (i.e., an ordinal row number of the row in the respective device's memory core—for example, if the rows of the array are addressed in order, from top to bottom, the internal row address that selects a row from top to bottom are 0, 1, 2, 3, . . . ) ensure that each set of neighboring rows for a given row address received by the module is different for each memory device in a module's rank, row hammering of a given externally addressed row spreads the row hammering errors across different externally addressed rows on each memory device. This has the effect of confining the row hammer errors for each row that is hammered to a single memory device during a column access (Read or Write). By confining the row hammer errors to a single memory device per column access, the row hammer errors are correctible using a SDDC scheme. In an embodiment, the module row address to device row address mappings comprise different permutations of the module row address bits for each memory device on the module.

The descriptions and embodiments disclosed herein are made primarily with references to DRAM devices and DRAM memory arrays. This, however, should be understood to be a first example where, due at least to the widespread adoption of DRAM technology, "row-hammer" has been observed and studied. It should be understood that other memory technologies that may be susceptible to "row-hammer" and therefore may also benefit from the methods and/or apparatus described herein. These memory technologies include, but are not limited to static random access memory (SRAM), non-volatile memory (such as flash), conductive bridging random access memory (CBRAM—a.k.a., programmable metallization cell—PMC), resistive random access memory (a.k.a., RRAM or ReRAM), magnetoresistive random-access memory (MRAM), Spin-Torque Transfer (STT-MRAM), phase change memory (PCM), and the like, and/or combinations thereof. Accordingly, it should be understood that in the disclosures and/or descriptions given herein, these aforementioned technologies may be substituted for, included with, and/or encompassed within, the references to DRAM, DRAM devices, and/or DRAM arrays made herein.

Figure 1B:
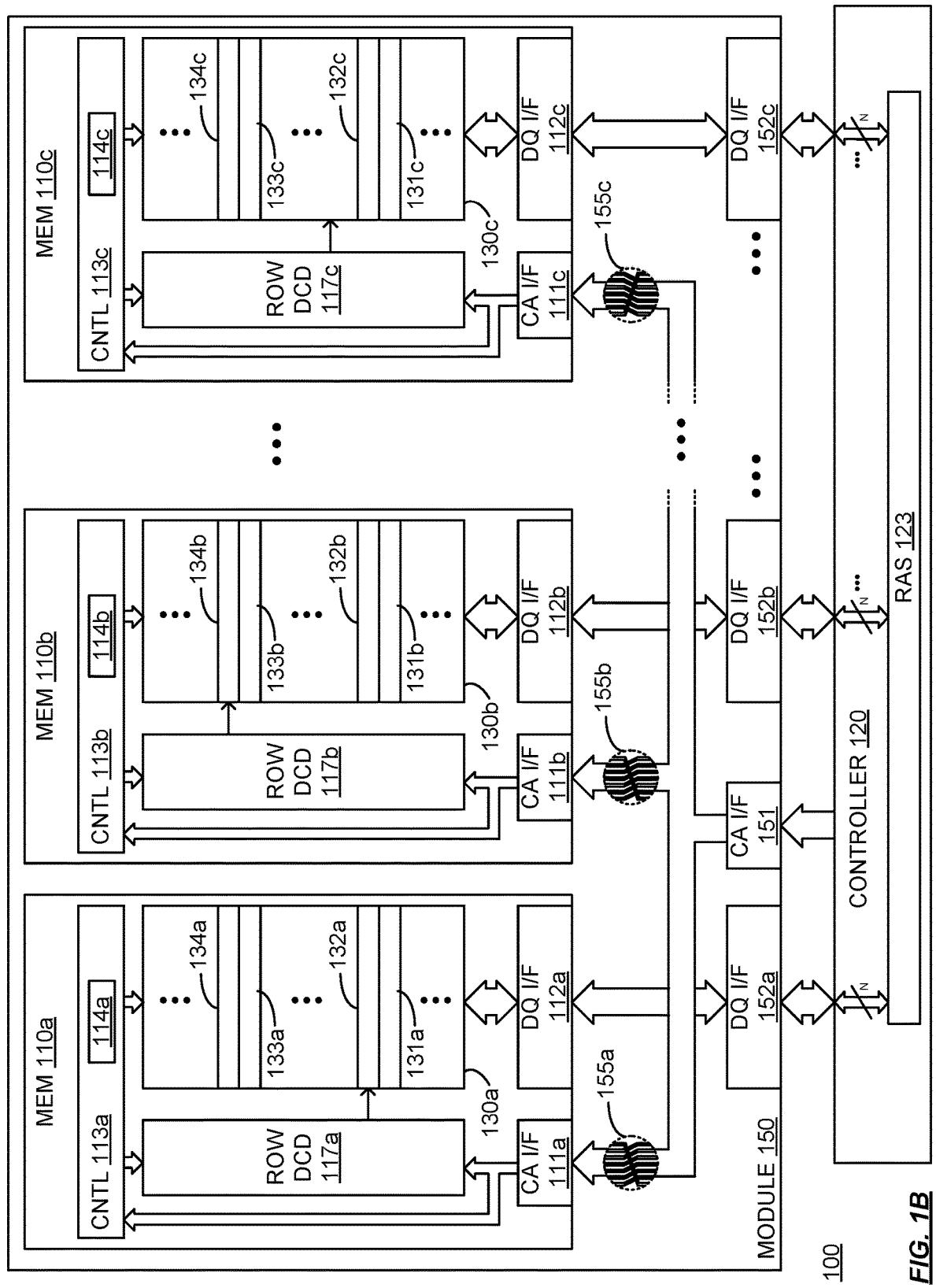

FIGS. 1A-1B are a block diagrams illustrating an example memory system. In FIGS. 1A-1B, memory system 100 comprises controller 120 and memory module 150. Controller 120 includes interfaces operatively coupled with memory module 150 (e.g., memory channel interfaces comprising command/address and data interfaces) and reliability, availability, and serviceability (RAS) circuitry 123 (e.g., error detect and correct—EDC, error correcting code—ECC, chipkill SDDC, memory scrubbing, etc. circuitry). Memory module 150 includes memory devices 110*a*-110*c*, command/address (CA) interface 151, data (DQ) interfaces 152*a*-152*c*, and address mapping interconnect 155*a*-155*c*. Memory devices 110*a*-110*c*, respectively, include memory device CA interfaces 111*a*-111*c*, DQ interfaces 112*a*-112*c*, control circuitry 113*a*-113*c*, memory arrays 130*a*-130*c*, and row decoders 117*a*-117*c*. Control circuitry 113*a*-113*c*, respectively, include reconstruction circuitry 114*a*-114*c*.

Rows 131*a*-134*a* of memory array 130*a*, rows 131*b*-134*b* of memory array 130*b*, and rows 131*c*-134*c* of memory array 130*c* are also illustrated in FIGS. 1A-1B. The vertical position of row 131*a* in memory array 130*a* is equivalent to the vertical position of row 131*b* in memory array 130*b* and row 131*c* in memory array 130*c*. This is intended to convey that rows 131*a*-131*c* each have the same internal row address. Thus, it should be understood that rows 132*a*-132*c* each have the same internal row address, rows 133*a*-133*c* each have the same internal row address, and rows 134*a*-134*c* each have the same row address. Because rows 131*a*-131*c* are each illustrated as physically next to rows 132*a*-132*c*, respectively, it should also be understood that rows 131*a*-131*c* are physically adjacent (i.e., are neighboring rows) to rows 132*a*-132*c*, respectively. Similarly, rows 133*a*-133*c* are neighboring rows to rows 134*a*-134*c*, respectively.

CA interfaces 111*a*-111*c*, of memory devices 110*a*-110*c*, respectively, are operatively coupled to memory arrays 130*a*-130*c*, respectively. Row addresses received via CA interfaces 111*a*-111*c* (a.k.a., external row addresses) are respectively operatively coupled to memory arrays 130*a*-130*c* via row decoders 117*a*-117*c* (e.g., row address decoders, buffers, etc.) Column addresses received via CA interface 111*a*-111*c* are operatively coupled to memory arrays 130*a*-130*c*, respectively, via column circuitry (e.g., column address decoders, buffers, etc.).

Controller 120 and memory devices 110*a*-110*c* may be integrated circuit type devices, such as are commonly referred to as "chips". A memory controller, such as controller 120, manages the flow of data going to and from memory devices and/or memory modules (e.g., memory module 150). Memory devices 110 may be standalone devices, or may be components of a memory module such as a DIMM module used in servers. In an embodiment, memory devices 110*a*-110*c* may be a devices that adhere to, or are compatible with, a dynamic random access memory (DRAM) specification. In an embodiment, memory devices 110*a*-110*c* may be, or comprise, a device that is or includes other memory device technologies and/or specifications. Memory devices 110*a*-110*c* may be or comprise a stack of integrated circuit dies. A memory controller can be a separate, standalone chip, or integrated into another chip. For example, a memory controller 120 may be included on a single die with a microprocessor, included as a chip co-packaged with one or more microprocessor chips, included as part of a more complex integrated circuit system such as a block of a system on a chip (SOC), one or more dies in a stack of integrated circuit dies, or be remotely coupled to one or more microprocessors via a fabric interconnect or other type of interconnect.

DQ interfaces 152*a*-152*c* of memory module 150 are operatively coupled to controller 120. DQ interfaces 152*a*-152*c* of memory module 150 are respectively operatively coupled to DQ interfaces 112*a*-112*c* of memory devices 110*a*-110*c*. Thus, DQ interfaces 112*a*-112*c* of memory devices 110*a*-110*c* are operatively coupled to controller 120 via DQ interfaces 152*a*-152*c* of memory module 150. DQ interfaces 112*a*-112*c* of memory devices 110*a*-110*c* are operatively coupled to controller 120 to at least communicate data to be written/read to/from memory devices 110*a*-110*c*, respectively.

CA interface of controller 120 is operatively coupled to CA interface 151 of memory module 150. The CA interface of controller 120 is operatively coupled to CA interface 151 to communicate commands and addresses (e.g., row and column addresses) from controller 120 to memory module 150. CA interface 151 of memory module 150 is operatively coupled to device CA interfaces 111*a*-111*c* of memory devices 110*a*-110*c*. CA interface 151 of memory module 150 is operatively coupled to device CA interfaces 111*a*-111*c* of memory devices 110*a*-110*c* to communicate commands and addresses from CA interface 151 to CA interfaces 111*a*-111*c*. In particular, CA interface 151 is operatively coupled to CA interface 111*a* via address mapping interconnect 155*a*; CA interface 151 is operatively coupled to CA interface 111*b* via address mapping interconnect 155*b*; and, CA interface 151 is operatively coupled to CA interface 111*c* via address mapping interconnect 155*c*.

The commands communicated from controller 120 to memory module 150 include activate commands and an associated external row address to be communicated with memory devices 110*a*-110*c*. In an embodiment, memory module 150, and address mapping interconnects 155*a*-155*c* may permute and/or invert the bits of external row addresses received via CA interface 151. Address mapping interconnects 155*a*-155*c* may permute and/or invert the bits of external row addresses received via CA interface 151 in order to ensure that for any row address in a memory device's 110*a*-110*c* memory arrays 130*a*-130*c*, respectively, has unique neighbors compared to the other memory device's 110*a*-110*c* memory arrays 130*a*-130*c* being accessed. In other words, for any given external row address that's being activated, the external row address that maps to a neighboring row(s) will be different in each memory device's 110*a*-110*c* memory arrays 130*a*-130*c*. This ensures that errors are confined to a single memory device 110*a*-110*c*.

In an embodiment, address mapping interconnects 155*a*-155*c* uniquely (among the memory devices 110*a*-110*c* and address mapping interconnects 155*a*-155*c* on memory module 150) permute and/or invert the bits of at least external row addresses received via CA interface 151 before the external row addresses are received by memory devices 110*a*-110*c*. In an embodiment, address mapping interconnects 155*a*-155*c* uniquely (among the memory devices 110*a*-110*c* and address mapping interconnects 155*a*-155*c* on memory module 150) permute and/or invert the bits of some (but not all) of the external row addresses received via CA interface 151 before the external row addresses are received by memory devices 110*a*-110*c*. In an embodiment, a one of address mapping interconnects 155*a*-155*c* does not permute and/or invert the bits of external row addresses received via CA interface 151. In this case, other of address mapping interconnects 155*a*-155*c* permute and/or invert the bits of at least external row addresses to create unique (among memory devices 110*a*-110*c*) permutations and/or inversion of the bits of external row addresses received by memory devices 110*a*-110*c*. In an embodiment, CA interface 151 and/or CA interfaces 111*a*-111*c* communicate using differential signaling. Thus, inversions of bits may be accomplished by address mapping interconnects 155*a*-155*c* by exchanging, relative to how they were received by CA interface 151, the true and complement conductors of the differential signaling pair they are connected to at CA interface 111*a*-111*c*.

Each memory device 110*a*-110*c* receives external row addresses (e.g., associated with an activate command—ACT) via respective CA interfaces 111*a*-111*c* and provides the external row addresses to respective row decoders 117*a*-117*c*. Row decoders 117*a*-117*c* each activate a respective row in memory arrays 130*a*-130*c*.

In an embodiment, however, because address mapping interconnects 155*a*-155*c* have uniquely (among memory devices 110*a*-110*c* on memory module 150) permuted and/or inverted the row addresses received by respective memory devices 110*a*-110*c*, row decoders 117*a*-117*c* may each activate a row in a respective memory array 130*a*-130*c* that are each different (i.e., different internal row address) from the rows activated by the other row decoders 117*a*-117*c*. This is illustrated in FIG. 1B by the vertical positioning in memory arrays 130*a*-130*c* of rows 131*a*-134*a*, by the arrow running from row decoder 117*a* to row 132*a* of memory array 130*a*, the arrow running from row decoder 117*b* to row 134*b* of memory array 130*b*, and the arrow running from row decoder 117*c* to a row in memory array 130*c* that does not have the same internal address as either row 132*a* or 134*b*.

By uniquely configuring the address translations made by address mappings interconnects 155*a*-155*c* as they couple CA interface 151 to CA interfaces 111*a*-111*c*, the unique mappings may be selected such that row hammer affects different neighboring row address in each memory device 110*a*-110*c*. Because the CA interface 151 address to CA interfaces 111*a*-111*c* address mappings are selected to ensure that each set of neighboring rows inside of memory devices 110*a*-110*c* for a given CA interface 151 addressed row is different for each memory device 110*a*-110*c* on memory module 150, row hammering of a given CA interface 151 addressed row is spread across different internally addressed rows on respective memory devices 110*a*-110*c*.

This has the effect of confining row hammer errors for each internal row that is hammered to a single memory device per CA interface 151 addressed neighboring row. By confining the row hammer errors to a single memory device 110a-110c (per column access), the row hammer errors are correctible by RAS circuitry 123 using, for example, a SDDC scheme.

In an embodiment, the mappings that address mapping interconnects 155a-155c apply may be selected from a set of row address bit permutations. For example, address mapping interconnects 155a-155c may each circularly left shift (or circularly right shift) the CA interface 151 received row address to generate row addresses that are provided to CA interfaces 111a-111c that each select a different row in their respective memory arrays 130a-130c.

It should be understood that in some instances, multiple neighboring rows may be affected by row hammer. In an embodiment, address mapping interconnects 155a-155c may be selected to ensure the two (or more) nearest neighbors on either side of the hammered row are unique in each memory device 110a-110c being accessed. For example, circularly left shifting (or right shifting) by two bits increases the number of unique neighbor row addresses that are next to a hammered row.

Table 1 illustrates an abbreviated example of unique bit shifts per memory device 110a-110c that may be provided by address mapping interconnects 155a-155c to translate CA interface 151 received row addresses to unique memory device 110a-110c received row addresses that result in accesses to a given CA interface 151 received address having different neighboring rows internal to each memory device 110a-110c of memory module 150. The CA interface 151 received and the memory device 110a-110c received addresses in Table 1 are given in hexadecimal format. In the example of Tables 1, memory arrays 130a-130c have 32 rows resulting in 5-bit internal and external row addresses.

or data communicated via signal lines that have been mapped by address mapping interconnects 155a-155c may be correctly interpreted and/or used by control circuitry 113a-113c. Sources of information to configure reconstruction circuitry 114a-114c may include serial presence detect storage on memory module 150, commands from controller 120, hardwired external configuration signals, etc.

In an embodiment, to develop the configuration information and/or configure reconstruction circuitry, controller 120 may place one or more memory devices 110a-110c in a training mode. Controller 120 may then transmit a training sequence of addresses to memory module 150 (e.g., a walking "1" or "0" pattern). When the training sequence is transformed by address mapping interconnects 155a-155c on memory module 150, each memory device 110a-110c receives a modified (e.g., with permuted and/or inverted bits) training sequence. Based on the respective modified training sequence that each memory device 110a-110c receives, the respective control circuitry 113a-113c determines a respective reverse transformation (i.e., reconstruction transformation) and/or configuration of reconstruction circuitry 114a-114c that undoes the effects of the address mapping interconnects 155a-155c connected to that respective memory device 110a-110c.

Figure 2:
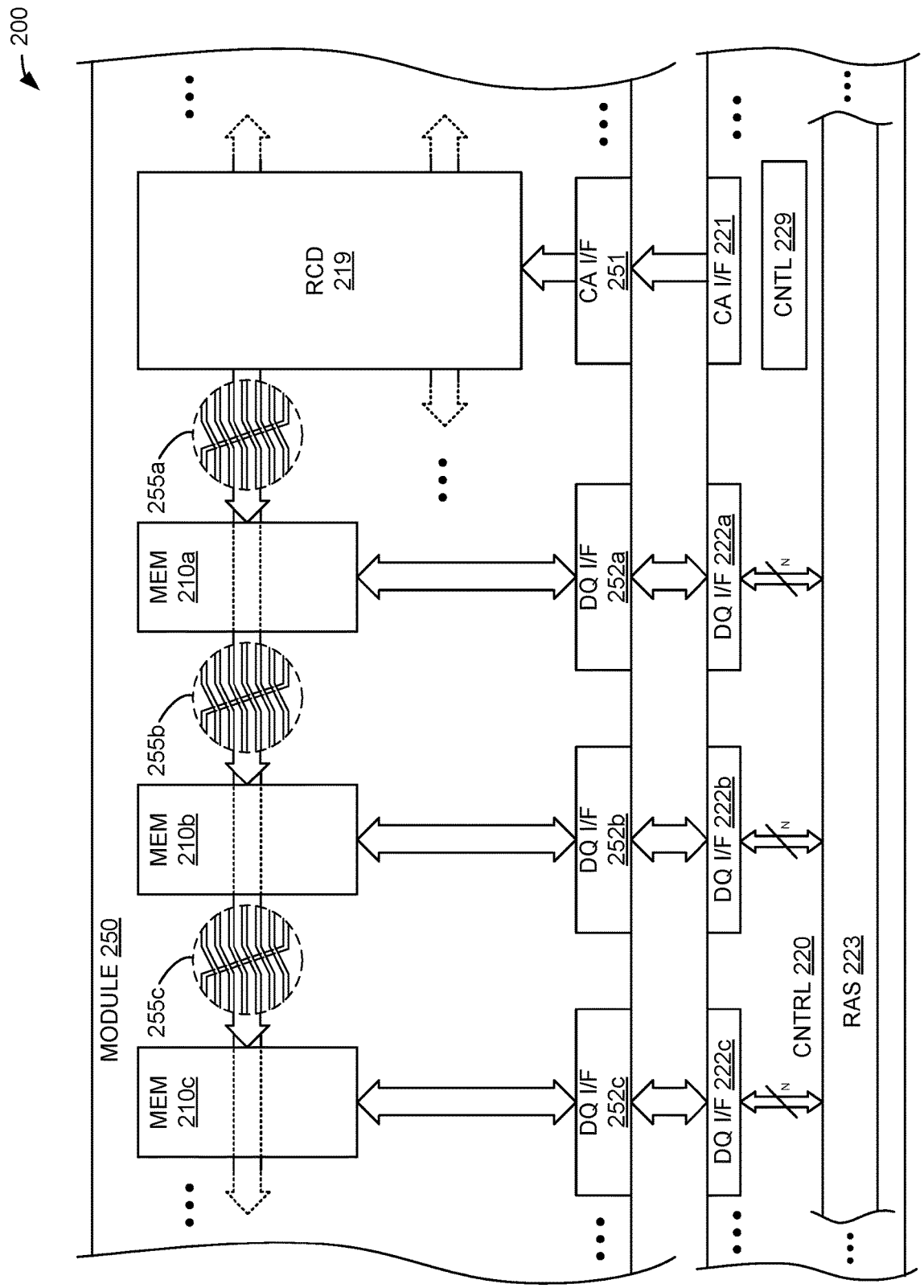
FIG. 2 is a block diagram illustrating an example buffered memory module system.

FIG. 2 is a block diagram illustrating an example buffered memory module system. In FIG. 2, memory system 200 comprises controller 220 and memory module 250. Controller 220 includes data (DQ) interfaces 222a-222c, command/address interface 221, reliability, availability, and serviceability (RAS) circuitry 223 (e.g., error detect and correct—EDC, error correcting code—ECC, chipkill SDDC, memory scrubbing, etc. circuitry), and control circuitry 229. DQ interfaces 222a-222c and command/address interface 221 are operatively coupled with memory module 250 (i.e., DQ interfaces 222a-222c and command/address interface 221

TABLE 1

| Device CA received and/or corresponding DRAM Core Row (Internal Row Address) | DRAM#0 Controller Row Address that Maps to memory array internal row address shown in First Column of this Table Circular left shift of Controller Row Address by 0 bits | DRAM#1 Controller Row Address that Maps to memory array internal row address shown in First Column of this Table Circular left shift of Controller Row Address by 1 bit | DRAM #2 Controller Row Address that Maps to memory array internal row address shown in First Column of this Table Circular left shift of Controller Row Address by 2 bits | |
|---|---|---|---|---|
| 00 | 00 | 00 | 00 | ... |
| 01 | 01 | 10 | 08 | |
| 02 | 02 | 01 | 10 | |
| 03 | 03 | 11 | 18 | |
| 04 | 04 | 02 | 01 | |
| 05 | 05 | 12 | 09 | |
| ... | ... | ... | ... | |
| 1C | 1C | 0E | 07 | |
| 1D | 1D | 1E | 0F | |
| 1E | 1E | 0F | 17 | |
| 1F | 1F | 1F | 1F | |

In an embodiment, control circuitry 113a-113c may receive and perform commands that have operands and/or data communicated via signal lines that have been mapped by address mapping interconnects 155a-155c. Reconstruction circuitry 114a-114c may be configured to respectively undo (i.e., unmap) the mapping applied by address mapping interconnects 155a-155c. In this manner, the operands and/ form a controller memory channel interface comprising command/address and data functions.)

Memory module 250 includes memory devices 210a-210c, registering clock driver (RCD) 219, command/address (CA) interface 251, data (DQ) interfaces 252a-252c, and address mapping interconnect 255a-255c. DQ interfaces 252a-252c of memory module 250 are respectively operatively coupled to DQ interfaces 222a-222c of controller 220. DQ interfaces 252a-252c of memory module 250 are respectively operatively coupled to DQ interfaces of memory devices 210a-210c. Thus, the DQ interfaces of memory devices 210a-210c are operatively coupled to DQ interfaces 222a-222c of controller 220 via DQ interfaces 252a-252c of memory module 150. The DQ interfaces of memory devices 210a-210c are operatively coupled to controller 220 to at least communicate data to be written/read to/from memory devices 210a-210c, respectively.

Command address interface 251 is operatively coupled to RCD 219—alternatively called a "Address-buffer component". RCD 219 is operatively coupled to memory devices 210a-210c. RCD 219 is operatively coupled to memory devices 210a-210c to selectively interpret and retransmit, to memory devices 210a-210c, the control signals and addresses transmitted by controller 220 via CA interface 221 and received by memory module 250 via CA interface 251.

Memory devices 210a-210c receive commands/addresses from controller 220 via RCD 219. Memory device 210a receives commands/addresses from RCD 219 via address mapping interconnect 255a. Memory device 210b receives commands/addresses from RCD 219 via address mapping interconnect 255b. Memory device 210c receives commands/addresses from RCD 219 via address mapping interconnect 255c, and so on for other devices that may be included on memory module 250.

In an embodiment, the address translations made by address mapping interconnects 255a-255c as they couple RCD 219 to memory devices 210a-210a are unique to each memory device 210a-210c. These unique mappings may be selected such that row hammer affects different neighboring row address in each memory device 210a-210c are reduced, mitigated, or eliminated. The address mappings implemented by address mapping interconnects 255a-255c as they couple RCD 219 to memory devices 210a-210c are selected to ensure that each set of neighboring rows inside of memory devices 210a-210c are different for each memory device 210a-210c on memory module 250. Thus, row hammering of a given addressed row (via CA interface 221 and CA interface 251) is spread across different internally addressed rows on respective memory devices 210a-210c. This has the effect of confining row hammer errors for each internal row that is hammered to a single memory device per controller 220 addressed neighboring row (per column access). By confining the row hammer errors to a single memory device 210a-210c, the row hammer errors are correctible by RAS circuitry 223 using, for example, a SDDC scheme.

In an embodiment, as described herein with reference to FIG. 1, the mappings that address mapping interconnects 255a-255c apply may be selected from a set of row address bit permutations. For example, address mapping interconnects 255a-255c may each circularly left shift (or circularly right shift) the controller 220 transmitted row address to generate row addresses that are provided to CA interfaces 211a-211c that each select a different row in their respective memory arrays 230a-230c. It should be understood that in some instances, multiple neighboring rows may be affected by row hammer. In an embodiment, address mapping interconnects 255a-255c may be selected to ensure the two (or more) nearest neighbors on either side of the hammered row are unique in each memory device 210a-210c being accessed. For example, circularly left shifting (or right shifting) by two bits increases the number of unique neighbor row addresses that are next to a hammered row.

As illustrated by the multiple arrows coming from RCD 219 that represent multiple CA interfaces, the set of memory devices 210a-210c that work together on a Read or a Write can be split among these multiple CA interfaces coming out of the RCD 219. It should then be understood, for example, that 8-10 memory devices 210a-210c on module 250 may respond to a Read or Write command. If all memory devices 210a-210c on module 250 were on the same CA interface coming from the RCD 219 the electrical loading may make signal integrity very difficult to achieve. Thus RCD 219 may have multiple CA interfaces ("arms") with a portion (e.g., one-half, one-quarter, etc.) of the memory devices 210a-210c on module 250 on a given, single, CA interface, and the other portion(s) on another CA interface(s). In an embodiment, module 250 may implement different address maps on each arm. Module 250 may implement different address maps on each arm such that all memory devices 210a-210c on both arms have unique internal neighboring rows for each external row address (because all memory devices 210a-210c on both arms work together to reply to each Read/Write request).

FIG. 3 is a flowchart illustrating a method of operating a memory module. One or more steps illustrated in FIG. 3 may be performed by, for example, memory system 100, memory system 200, and/or their components. Via a command/address interface, a first row address composed of a first plurality of address bits is received (302). For example, memory module 150 may receive, from controller 120, a first row address associated with a command (e.g., activate command).

By a first dynamic random access memory (DRAM) device on the memory module that includes a first memory array, a second row address composed of a first permutation of the first plurality of address bits is received (304). For example, memory device 110a may receive a second row address that is at least a permutation, by address mapping interconnect 155a, of the bits of the first address. Based on the second row address, a first row in the first memory array that has a first internal row address is accessed, where the first row is physically next to a first neighboring row having a first internal neighboring row address (306). For example, based on the second row address, memory device 110a may access row 132a that is physically next to row 131a.

By a second DRAM device on the memory module that includes a second memory array, a third row address composed of a second permutation of the first plurality of address bits is received (308). For example, memory device 110b may receive a third row address that is at least a permutation, by address mapping interconnect 155b, of the bits of the first address.

Based on the third row address, a second row is accessed in the second memory array that has a second internal row address, where the second row is physically next to a second neighboring row having a second internal neighboring row address, and where a first external row address received via the command/address interface that maps to the first internal neighboring row address and a second external row address received via the command/address interface that maps to the second internal neighboring row address are not equal (310). For example, based on the third row address, memory device 110b may access row 134b that is physically next to row 133b, where the internal addresses of row 131a and row 133b are not equal.

Figure 4:
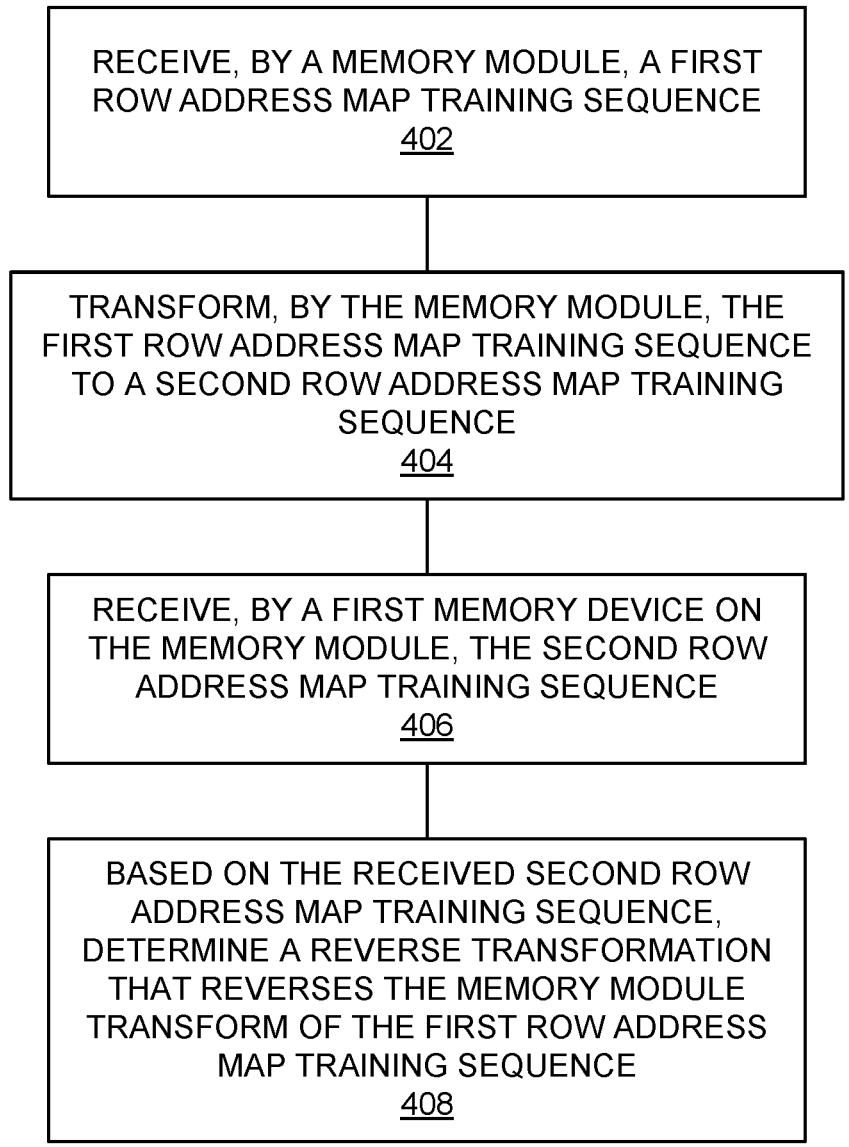
FIG. 4 is a flowchart illustrating a method of determining a transformation to reverse an interconnect based address transformation.

FIG. 4 is a flowchart illustrating a method of determining a transformation to reverse an interconnect based address transformation. One or more steps illustrated in FIG. 4 may be performed by, for example, memory system 100, memory system 200, and/or their components. By a memory module, a first row address map training sequence is received (402).

For example, controller 120 may transmit, via CA interface 151 and to CA interface 151, a first training sequence to be used by memory devices 110a-110c to find, or determine, the effects, mappings, and/or transformations made by address mapping interconnects 155a-155c, respectively. For example, controller 120 may transmit a "walking" one or zero pattern where the first address in the sequence is all zeros except for the least significant bit, the second address in the sequence is all zeros except for the second least significant bit, the third address in the sequence is all zeros except for the third least significant bit, and so on.

By the memory module, the first row address map training sequence is transformed to a second row address map training sequence (404). For example, the training sequence transmitted by controller 120 may be transformed by address mapping interconnect 155a on memory module 150 into a second training sequence, derived from the first training sequence by the permutation and/or inversion of bits from the first training sequence by address mapping interconnect 155a. By a first memory device on the memory module, the second row address map training sequence is received (406). For example, memory device 110a may receive the second training sequence, which was derived from the first training sequence by a permutation and/or inversion of bits by address mapping interconnect 155a.

Based on the received second row address map training sequence, a reverse transformation is determined that reverses the memory module transform of the first row address map training sequence (408). For example, control circuitry 113a may, based on the second training sequence, determine what permutation and/or inversions were applied to the first training sequence by address mapping interconnect 155a. Once the permutation and/or inversions applied by address mapping interconnect 155a are known, control circuitry 113a can determine how to configure reconstruction circuitry 114a to undo the permutation and/or inversions.

FIG. 5 is a flowchart illustrating a method of determining address transformations. One or more steps illustrated in FIG. 5 may be performed by, for example, memory system 100, memory system 200, and/or their components. By a memory module that includes a first memory device and a second memory device, a first training sequence of address values is received (502). For example, controller 120 may transmit, via CA interface 151 and to CA interface 151, a first training sequence of address values to memory module 150 that the memory devices 110a-110c on memory module 150 may use to find, or determine, the effects, mappings, and/or transformations made by address mapping interconnects 155a-155c, respectively. For example, controller 120 may transmit a "walking" one or zero pattern to memory module 150.

Using a first permutation of bits in the address values and by the memory module, the first training sequence of address values are transformed into a first transformed sequence of address values (504). For example, the address values in the training sequence transmitted by controller 120 may be transformed by address mapping interconnect 155a on memory module 150 into a first transformed training sequence of address values that is derived from the training sequence transmitted by controller 120 by the permutation and/or inversion of bits from the training sequence by address mapping interconnect 155a.

By the first memory device, the first transformed sequence of address values is received (506). For example, memory device 110a may receive the address values of the first transformed training sequence of address values. Memory device 110a may, for example, transmit the first transformed sequence of address values to controller 120 for analysis. Memory device 110a may, for example, transmit the first transformed sequence of address values to controller 120 for analysis using DQ interface 112a. Using a second permutation of bits in the address values and by the memory module, the first training sequence of address values are transformed into a second transformed sequence of address values (508). For example, the address values in the training sequence transmitted by controller 120 may be transformed by address mapping interconnect 155b on memory module 150 into a second transformed training sequence of address values that is derived from the training sequence transmitted by controller 120 by the permutation and/or inversion of bits from the training sequence by address mapping interconnect 155b.

By the second memory device, the second transformed sequence of address values is received (510). For example, memory device 110b may receive the address values of the second transformed training sequence of address values. Memory device 110b may, for example, transmit the first transformed sequence of address values to controller 120 for analysis. Memory device 110b may, for example, transmit the first transformed sequence of address values to controller 120 for analysis via DQ interface 112b. Based on the first transformed sequence of address values, it is determined that the first memory device is receiving addresses that have been transformed by at least the first permutation (512). For example, control circuitry 113a and/or controller 120 may, based on first transformed sequence of address values, determine that the first permutation was applied to the first training sequence of address values by address mapping interconnect 155a before being received by memory device 110a. Based on the second transformed sequence of address values, it is determined that the second memory device is receiving addresses that have been transformed by at least the second permutation (514). For example, control circuitry 113b and/or controller 120 may, based on second transformed sequence of address values, determine that the second permutation was applied to the first training sequence of address values by address mapping interconnect 155b before being received by memory device 110b.

FIG. 6 is a flowchart illustrating a method of reversing address transformations. One or more steps illustrated in FIG. 6 may be performed by, for example, memory system 100, memory system 200, and/or their components. A first indicator that a first memory device on a memory module is receiving addresses that have been transformed by at least a first permutation is received (602). For example, controller 120 may receive information (e.g., from memory module 150, a host, SPD circuitry on memory module 150 etc.) indicating that address mapping interconnect 155a will permute, with a first permutation, row address transmitted by controller 120 to memory module 150. A second indicator that a second memory device on a memory module is receiving addresses that have been transformed by at least a second permutation is received (604). For example, controller 120 may receive information (e.g., from memory module 150, a host, SPD circuitry on memory module 150 etc.) indicating that address mapping interconnect 155b will permute, with a second permutation, row address transmitted by controller 120 to memory module 150.

The first memory device is configured to reverse the first permutation on received addresses (606). For example, controller 120 may configure reconstruction circuitry 114a to reverse the effects of address mapping interconnect 155a. The second memory device is configured to reverse the second permutation on received addresses (608). For example, controller 120 may configure reconstruction circuitry 114b to reverse the effects of address mapping interconnect 155b.

A first address is transmitted to the memory module (610). For example, controller 120 may transmit an address to memory module 150 in association with a command to set a register. By the first memory device, an unpermuted version of the first address is used (612). For example, memory device 110a may use an unpermuted version, as reconstructed by reconstruction circuitry 114a, of the address transmitted in association with the command to set a register. By the second memory device, an unpermuted version of the first address is used (614). For example, memory device 110b may use an unpermuted version, as reconstructed by reconstruction circuitry 114b, of the address transmitted in association with the command to set a register.

FIG. 7 is a flowchart illustrating a method of transmitting addresses. One or more steps illustrated in FIG. 7 may be performed by, for example, memory system 100, memory system 200, and/or their components. A first indicator that a first memory device on a memory module is receiving addresses that have been transformed, by the memory module and by a first transformation that includes a first permutation (702). For example, controller 120 may receive information indicating that addresses transmitted to memory module 150 will be transformed by address mapping interconnect 155a before being received by memory device 110a, where address mapping interconnect 155a performs a first permutation of the address bits (e.g., circular left shift by 1 bit).

A second indicator that a second memory device on the memory module is receiving addresses that have been transformed, by the memory module and by a second transformation that includes a second permutation that is not equivalent to the first permutation (704). For example, controller 120 may receive information indicating that addresses transmitted to memory module 150 will be transformed by address mapping interconnect 155b before being received by memory device 110b, where address mapping interconnect 155b performs a second permutation of the address bits that is not equivalent to the first permutation (e.g., circular left shift by 2 bits).

To a first address value, a first reverse transformation of the first transformation is applied to generate a second address value (706). For example, in order to send a first address value (e.g., '00000001') to memory device 110a, controller 120 may apply a reverse transformation (e.g., circular right shift by 1 bit) of the first permutation (e.g., circular left shift by one bit) to generate a second address value (e.g., '10000000') that is the reverse transformed version of the first address value. The second address value is transmitted to the memory module (708). For example, controller 120 may transmit the reverse transformed first address value (e.g., '10000000') By the first memory device, the first address value is received (710). For example, the reverse transformed value sent by controller 120 may be transformed by address mapping interconnect 155a from the second address value (e.g., '10000000') back in to the first address value (e.g., '00000001' and then is received by memory device 110a.

To the first address value, a second reverse transformation of the second transformation is applied to generate a third address value (712). For example, in order to send a first address value (e.g., '00000001') to memory device 110b, controller 120 may apply a reverse transformation (e.g., circular right shift by 2 bits) of the second permutation (e.g., circular left shift by two bits) to generate a third address value (e.g., '01000000') that is the second reverse transformed version of the first address value. The third address value is transmitted to the memory module (714). For example, controller 120 may transmit the second reverse transformed first address value (e.g., '01000000') By the second memory device, the first address value is received (716). For example, the second reverse transformed value sent by controller 120 may be transformed by address mapping interconnect 155b from the third address value (e.g., '01000000') back in to the first address value (e.g., '00000001' and then is received by memory device 110a.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, memory system 200, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 8:
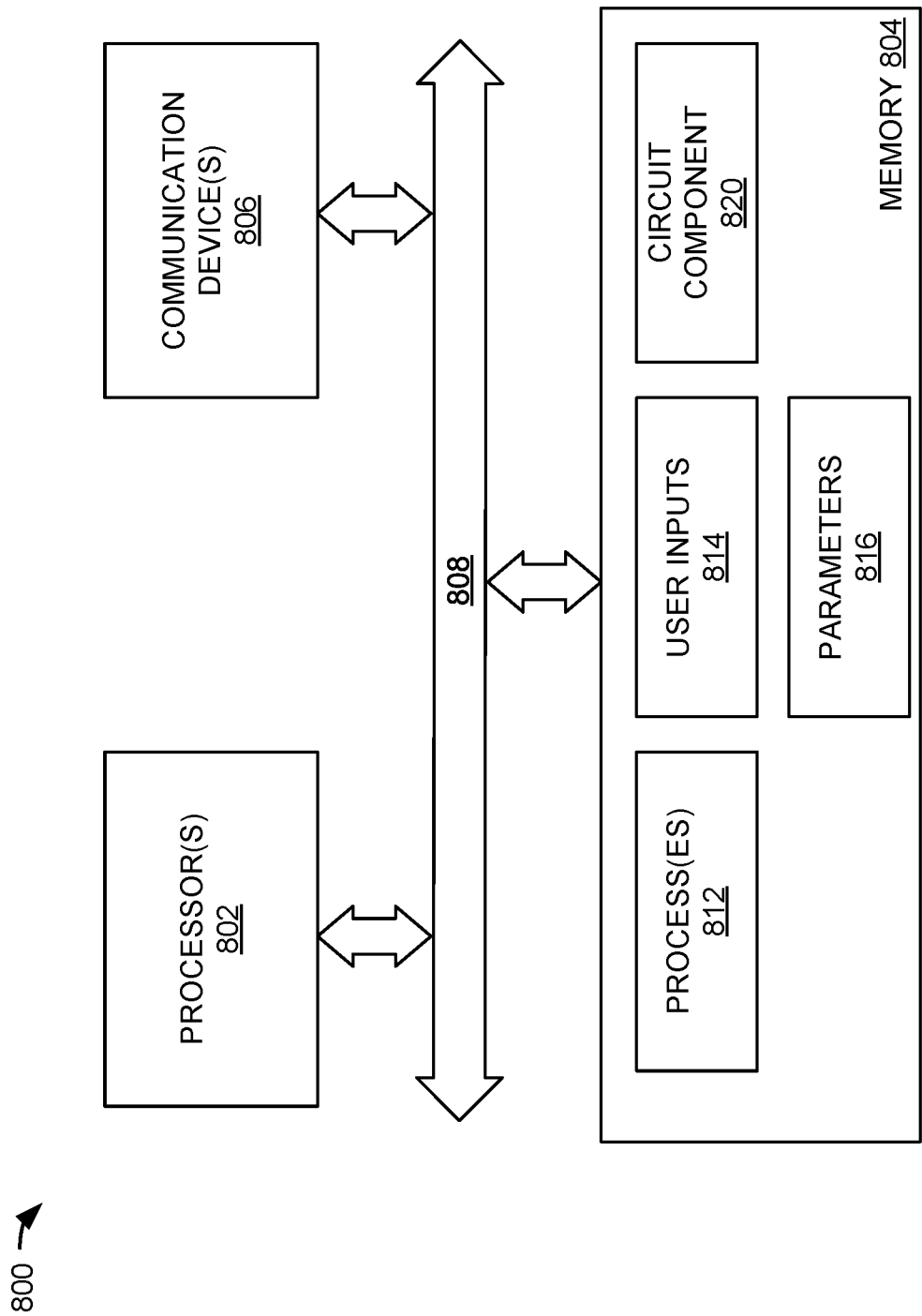
FIG. 8 is a block diagram of a processing system.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of memory system 100, memory system 200, and their components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email.

User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

Implementations discussed herein include, but are not limited to, the following examples:

Example 1: A memory module, comprising: a command/address interface to receive a first row address; a first memory device including a first memory array, the first memory device to receive a second row address generated from the first row address using a first mapping, the second row address to access a first row in the first memory array having a first internal row address, the first row to be physically next to a first neighboring row having a first internal neighboring row address; and a second memory device including a second memory array, the second memory device to receive a third row address generated from the first row address using a second mapping, the third row address to access a second row in the second memory array having a second internal neighboring row address, the second row to be physically next to a second neighboring row having a second internal neighboring row address, wherein the first internal neighboring row address and the second internal neighboring row address do not address a same row.

Example 2: The memory module of example 1, wherein the first mapping comprises a first permutation function relating signals of the command/address interface to command/address signals of a first device command/address interface of the first memory device and the second mapping comprises a second permutation function relating signals of the command/address interface to signals of a second device command/address interface of the second memory device.

Example 3: The memory module of example 2, wherein the first mapping further comprises an inversion of a first signal between the command/address interface and the first device command/address interface of the first memory device.

Example 4: The memory module of example 2, further comprising a buffer integrated circuit that receives the signals of the command/address interface and transmits, to the first device command/address interface of the first memory device, a first permutation of the signals of the command/address interface made according to the first permutation function.

Example 5: The memory module of example 2, wherein the first permutation function circularly shifts the first row address by a first number of bits when mapping the first row address to the second row address, and the second permutation function circularly shifts the first row address by a second number of bits when mapping the first row address to the third row address.

Example 6: The memory module of example 3, further comprising a buffer integrated circuit that performs the inversion.

Example 7: The memory module of example 1, wherein the first memory device includes circuitry to, when in a first operating mode, translate the second row address to the first row address.

Example 8: The memory module of example 1, wherein the second memory device includes circuitry to, when in a second operating mode, translate the third row address to the first row address.

Example 9: A memory module, comprising: a command/address interface comprising a first plurality of command/address signals to receive a plurality of external row addresses; first signal interconnections operatively coupling the command/address interface and a first device command/address interface of a first memory device, the first signal interconnections implementing a first permutation of the first plurality of command/address signals between the command/address interface and the first device command/address interface; second signal interconnections operatively coupling the command/address interface and a second device command/address interface of a second memory device, the second signal interconnections implementing a second permutation of the first plurality of command/address signals between the command/address interface and the second device command/address interface, wherein the first permutation and the second permutation are not functionally equivalent.

Example 10: The memory module of example 9, wherein the command/address interface is to receive a first row address and the first permutation causes the first device command/address interface to receive a second row address, the second row address to access a first row in a first memory array of the first memory device having a first internal row address, the first row to be physically next to a first neighboring row having a first internal neighboring row address.

Example 11: The memory module of example 10, wherein the second permutation causes the second device command/address interface to receive a third row address, the third row address to access a second row in a second memory array of the second memory device having a second internal row address, the second row to be physically next to a second neighboring row having a second internal neighboring row address, wherein the first internal neighboring row address and the second internal neighboring row address are to be not equal.

Example 12: The memory module of example 11, wherein the first memory device comprises circuitry to undo the first permutation and the second memory device comprises circuitry to undo the second permutation.

Example 13: The memory module of example 12, wherein the first memory device undoes the first permutation based on receiving a mode setting command and the second memory device undoes the second permutation based on receiving the mode setting command.

Example 14: The memory module of example 13, wherein the first memory device comprises circuitry to detect the first permutation and configure the first memory device to undo the first permutation, and the second memory device comprises circuitry to detect the second permutation and configure the second memory device to undo the second permutation.

Example 15: A method of operating a memory module, comprising:
receiving, via a command/address interface, a first row address composed of a first plurality of address bits; receiving, by a first dynamic random access memory (DRAM) device on the memory module that includes a first memory array, a second row address composed of a first permutation of the first plurality of address bits; based on the second row address, accessing a first row in the first memory array that has a first internal row address, the first row to be physically next to a first neighboring row having a first internal neighboring row address; receiving, by a second DRAM device on the memory module that includes a second memory array, a third row address composed of a second permutation of the first plurality of address bits; and based on the third row address, accessing a second row in the second memory array that has a second internal row address, the second row to be physically next to a second neighboring row having a second internal neighboring row address, wherein a first external row address received via the command/address interface that maps to the first internal neighboring row address and a second external row address received via the command/address interface that maps to the second internal neighboring row address are not equal.

Example 16: The method of example 15, further comprising: mapping, by a first interconnect network on the memory module, the first row address to the second row address; and mapping, by a second interconnect network on the memory module, the first row address to the third row address.

Example 17: The method of example 15, wherein the first permutation of the first plurality of address bits is a first circular shift of the first row address by a first number of bits, and the second permutation of the first plurality of address bits is a second circular shift of the first row address by a second number of bits, wherein the first number of bits and the second number of bits produce circularly shifted outputs that are not equivalent.

Example 18: The method of example 15, further comprising: receiving a training sequence via the command/address interface; based on the training sequence, determining, by the first DRAM device, a third permutation function that reverses the first permutation; and based on the training sequence, determining, by the second DRAM device, a fourth permutation function that reverses the second permutation.

Example 19: The method of example 18, further comprising: receiving, via the command/address interface, first data composed of a first plurality of data bits; and by the first DRAM device, using the third permutation function to generate second data from the first plurality of data bits.

Example 20: The method of example 19, further comprising: by the second DRAM device, using the fourth permutation function to generate the second data from the first plurality of data bits.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory module, comprising:
a module command/address interface to receive a first row address;
a first memory device including a first memory array and a first device command/address interface, the first memory device to receive, via the first device command/address interface, a second row address generated from the first row address using a first mapping that comprises a first permutation function relating signals received via the module command/address interface to signals provided to the first device command/address interface, the second row address to access a first row in the first memory array having a first internal row address, the first row to be physically next to a first neighboring row having a first internal neighboring row address, the first memory device including circuitry to, when in a first operating mode, translate the second row address to the first row address; and
a second memory device including a second memory array and a second device command/address interface, the second memory device to receive, via the second device command/address interface, a third row address generated from the first row address using a second mapping that comprises a second permutation function relating signals received via the module command/address interface to signals provided to the second device command/address interface, the third row address to access a second row in the second memory array having a second internal neighboring row address, the second row to be physically next to a second neighboring row having a second internal neighboring row address, wherein the first internal neighboring row address and the second internal neighboring row address do not address a same row.

2. The memory module of claim 1, wherein the second memory device includes circuitry to, when in a second operating mode, translate the third row address to the first row address.

3. The memory module of claim 2, further comprising a buffer integrated circuit that receives the signals of the module command/address interface and transmits, to the first device command/address interface of the first memory device, a first permutation of the signals of the command/address interface made according to the first permutation function.

4. The memory module of claim 2, wherein the first permutation function circularly shifts the first row address by a first number of bits when mapping the first row address to the second row address, and the second permutation function circularly shifts the first row address by a second number of bits when mapping the first row address to the third row address.

5. The memory module of claim 1, wherein the first mapping further comprises an inversion of a first signal between the module command/address interface and the first device command/address interface of the first memory device.

6. The memory module of claim 5, further comprising a buffer integrated circuit that performs the inversion.

7. The memory module of claim 1, wherein the first memory device includes circuitry to, based on a training sequence received via the module command/address interface, determine a third permutation function that reverses the first permutation function.

8. The memory module of claim 7, wherein the second memory device includes circuitry to, based on the training sequence received via the module command/address interface, determine a fourth permutation function that reverses the second permutation function.

9. A memory module, comprising:
a module command/address interface comprising a first plurality of command/address signals to receive a plurality of external row addresses;
first signal interconnections operatively coupling the module command/address interface and a first device command/address interface of a first memory device, the first signal interconnections implementing a first permutation of the first plurality of command/address signals between the module command/address interface and the first device command/address interface, the first memory device including circuitry to, when in a first operating mode, undo the first permutation for signals received via the first device command/address interface;
second signal interconnections operatively coupling the module command/address interface and a second device command/address interface of a second memory device, the second signal interconnections implementing a second permutation of the first plurality of command/address signals between the module command/address interface and the second device command/address interface, the second memory device including circuitry to, when in a second operating mode, undo the second permutation for signals received via the second device command/address interface, wherein the first permutation and the second permutation are not functionally equivalent.

10. The memory module of claim 9, wherein the module command/address interface is to receive a first row address and the first permutation causes the first device command/address interface to receive a second row address, the second row address to access a first row in a first memory array of the first memory device having a first internal row address, the first row to be physically next to a first neighboring row having a first internal neighboring row address.

11. The memory module of claim 10, wherein the second permutation causes the second device command/address interface to receive a third row address, the third row address to access a second row in a second memory array of the second memory device having a second internal row address, the second row to be physically next to a second neighboring row having a second internal neighboring row address, wherein the first internal neighboring row address and the second internal neighboring row address are to be not equal.

12. The memory module of claim 11, wherein the first memory device comprises circuitry to, based on a training sequence received via the module command/address interface, determine a third permutation that will undo the first permutation and the second memory device comprises circuitry to, based on the training sequence received via the module command/address interface, determine a fourth permutation that will undo the second permutation.

13. The memory module of claim 12, wherein the first memory device undoes the first permutation based on receiving a mode setting command and the second memory device undoes the second permutation based on receiving the mode setting command.

14. The memory module of claim 9, wherein the first memory device comprises circuitry to detect the first permutation and configure the first memory device into the first operating mode, and the second memory device comprises circuitry to detect the second permutation and configure the second memory device into the second operating mode.

15. A method of operating a memory module, comprising:
receiving, via a module command/address interface of the memory module, a first row address composed of a first plurality of address bits;
receiving, by a first device command/address interface of a first dynamic random access memory (DRAM) device on the memory module that includes a first memory array, a second row address composed of a first permutation of the first plurality of address bits;
based on the second row address and based on the first DRAM device being in a first operating mode, accessing a first row in the first memory array that has a first internal row address, the first row to be physically next to a first neighboring row having a first internal neighboring row address;
receiving, by a second device command/address interface of a second DRAM device on the memory module that includes a second memory array, a third row address composed of a second permutation of the first plurality of address bits;
based on the third row address and based on the second DRAM device being in the first operating mode, accessing a second row in the second memory array that has a second internal row address, the second row to be physically next to a second neighboring row having a second internal neighboring row address, wherein a first external row address received via the module command/address interface that maps to the first internal neighboring row address and a second external row address received via the module command/address interface that maps to the second internal neighboring row address are not equal;
receiving, by the module command/address interface, a mode setting command to place the first DRAM device in a second operating mode and the second DRAM device in a third operating mode;
receiving, via the module command/address interface of the memory module, a fourth row address composed of a second plurality of address bits;
receiving, by the first device command/address interface of the first DRAM device, a fifth row address composed of the first permutation of the second plurality of address bits; and
based on the fifth row address and based on the first DRAM device being in the second operating mode, translating, by the first DRAM device, the fifth row address into the fourth row address.

16. The method of claim 15, further comprising:
mapping, by a first interconnect network on the memory module, the first row address to the second row address; and
mapping, by a second interconnect network on the memory module, the first row address to the third row address.

17. The method of claim 15, wherein the first permutation of the first plurality of address bits is a first circular shift of the first row address by a first number of bits, and the second permutation of the first plurality of address bits is a second circular shift of the first row address by a second number of bits, wherein the first number of bits and the second number of bits produce circularly shifted outputs that are not equivalent.

18. The method of claim 15, further comprising:
receiving a training sequence via the module command/address interface;
based on the training sequence, determining, by the first DRAM device, a third permutation function that reverses the first permutation; and
based on the training sequence, determining, by the second DRAM device, a fourth permutation function that reverses the second permutation.

19. The method of claim 18, further comprising:
receiving, via the module command/address interface, first data composed of a first plurality of data bits; and
by the first DRAM device, using the third permutation function to generate second data from the first plurality of data bits.

20. The method of claim 19, further comprising:
by the second DRAM device, using the fourth permutation function to generate the second data from the first plurality of data bits.

* * * * *